US006946602B1

(12) United States Patent
Gibbs et al.

(10) Patent No.: US 6,946,602 B1
(45) Date of Patent: Sep. 20, 2005

(54) QUADRIFOLD HOUSING ASSEMBLY FOR ELECTRONICS

(75) Inventors: Irving Albert Gibbs, Fletcher, NC (US); Steven Dale Walker, Etowah, NC (US); Thomas Arthur Farr, Candler, NC (US); Marcus Eugene Case, Morganton, NC (US); Tap Van Pham, Asheville, NC (US); Rafael Gutierrez, Asheville, NC (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 10/864,910

(22) Filed: Jun. 9, 2004

(51) Int. Cl.[7] .............................................. H05K 5/06
(52) U.S. Cl. ..................... 174/52.3; 174/50; 174/52 R; 174/52.1; 174/50.54; 174/53; 220/241; 220/242; 220/3.2; 220/3.8; 361/683; 361/725
(58) Field of Search ...................... 174/52.3, 50, 52 R, 174/52.1, 50.54, 53; 220/241, 242, 3.2, 3.8; 361/683, 725

(56) References Cited

U.S. PATENT DOCUMENTS

| 4,375,584 A | 3/1983 | Muzumdar et al. |
| 4,893,263 A | 1/1990 | Myers |
| 5,745,342 A | 4/1998 | Jeffries et al. |
| 6,174,097 B1 | 1/2001 | Daniel |
| 6,297,948 B1 * | 10/2001 | Buican et al. .............. 361/683 |
| 6,317,329 B1 * | 11/2001 | Dowdy et al. .............. 361/725 |
| 6,575,647 B1 | 6/2003 | Daniel |

\* cited by examiner

*Primary Examiner*—Anthony Dinkins
*Assistant Examiner*—Anton Harris
(74) *Attorney, Agent, or Firm*—Martin J. Moran

(57) ABSTRACT

A housing assembly, structured to enclose a plurality of electrical components and flexible cables, each the electrical component coupled at least one other electrical component or to an input device by the cables, includes a plurality of mounting plate members and a plurality of vertical walls. The plurality of mounting plate members includes at least a bottom mounting plate member and at least one movable mounting plate member. Each mounting plate structured to support one or more electrical components. The plurality of vertical walls include a front wall coupled to, and extending generally perpendicular to, the base plate member, a first side wall coupled to, and extending generally perpendicular to, the base plate member, a second side wall coupled to, and extending generally perpendicular to, the base plate member, a back wall coupled to, and extending generally perpendicular to, the base plate member. The movable mounting plate member is pivotally coupled to the at least one vertical wall and is structured to move between a first, closed position and a second open position. Thus, a plurality of electronic components may be coupled to each plate in the plurality of plates, and whereby the electronic components remain coupled to each other as the movable mounting plates move between the first, closed position and the second, open position.

20 Claims, 10 Drawing Sheets

QUADRIFOLD HOUSING ASSEMBLY FOR ELECTRONICS

BACKGROUND OF THE INVENTION

1. Field of the Invention

The present invention relates to a housing assembly for electric components and, more specifically, to a housing assembly having a plurality of pivotal mounting plates to which electric components may be coupled so that the components, while operably connected, may be pivoted to an exposed position so that a user may access the components.

2. Background Information

Housing assemblies for electrical components are typically structured to accommodate one or more printed circuit boards or other electrical components. The electrical components are coupled to mounting brackets within the housing assembly. Because printed circuit boards tend to have a sheet-like structure, and to reduce the space the housing occupies, the printed circuit boards are typically mounted in a generally parallel and adjacent manner. The electrical components are coupled to each other, or to an input/output port by one or more cables. This configuration allows a number of electrical components to be mounted in a single enclosure.

The disadvantage to such a housing assembly is that to access the electrical components, the components must be removed from the housing assembly. When the electrical components are removed from the housing assembly, the components are no longer operably connected. Thus, when a problem occurs, a user must open the housing assembly, disconnect all of the cables, remove the electrical components, repair or replace the suspected faulty component, and then reinstall and connect the electrical components and cables. If the wrong component was removed, the procedure must be repeated until the faulty component is repaired or replaced. The act of repeatedly assembling and disassembling the electrical components and cables is a time-consuming task.

There is, therefore, a need for a housing assembly that allows a user to access the electrical components while the components remain operably connected to each other.

There is a further need for a housing assembly that allows a user to quickly move electrical components between an enclosed position and an exposed position.

There is a further need for such a housing assembly to be adapted for use with existing electrical components.

SUMMARY OF THE INVENTION

These needs, and others, are met by the present invention which provides a housing assembly having a plurality of vertical walls and a plurality of mounting plate members wherein the mounting plate members are pivotally attached to the vertical walls. The mounting plate members are structured to move from a first, closed position to a second, open position. While in the first, closed position, selected mounting plate members, preferably the top and bottom mounting plate members, in combination with the vertical walls define an enclosed space. The other mounting plate members are disposed within the enclosed space. When the mounting plate members are moved to the second, open position, the mounting plates are exposed and a user may access the enclosed space.

In a preferred embodiment, the housing assembly includes a bottom mounting plate member, and a first and a second vertical side wall. The first and second side walls are attached, and extend generally perpendicularly, upwardly, from the bottom mounting plate member. The housing assembly further includes a front vertical wall and back vertical wall. The front and back vertical walls each have a lower edge and are pivotally coupled to the bottom mounting plate member at the lower edge. The front and back vertical walls may pivot between a first position where the walls extend generally vertically and a second position where the walls extend generally horizontally. The housing assembly further includes an upper mounting plate member having a lateral edge, and outer side and an inner side. The outer side forms the top of the housing assembly when the housing assembly is in a closed configuration. The lateral edge of the upper mounting plate member is pivotally coupled to the top edge of one of the side walls. The upper mounting plate member is structured to move between a first position where the upper mounting plate extends generally horizontally over the bottom mounting plate member, and a second position where the upper mounting plate member has been pivoted about 180 degrees so that the upper mounting plate member extends generally horizontally to the side of the bottom mounting plate member. The housing assembly further includes an intermediate mounting plate member which is pivotally coupled to a medial portion of the opposing vertical side wall. The intermediate mounting plate member is structured to move between a first position wherein the intermediate mounting plate member extends generally horizontally over the bottom mounting plate member, and a second position wherein the intermediate mounting plate member extends generally vertically away from the bottom mounting plate member. Thus, when all the mounting plate members and vertical walls are in the first position, the assembly generally forms a box defining an enclosed space. When the mounting plate members and vertical walls are in the second position, each of the mounting plate members are substantially exposed. Accordingly, when electrical components are attached to the mounting plate members and coupled by flexible cables, the enclosure may be quickly moved between the first and second positions while the electrical components remain operationally coupled to each other.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1A:
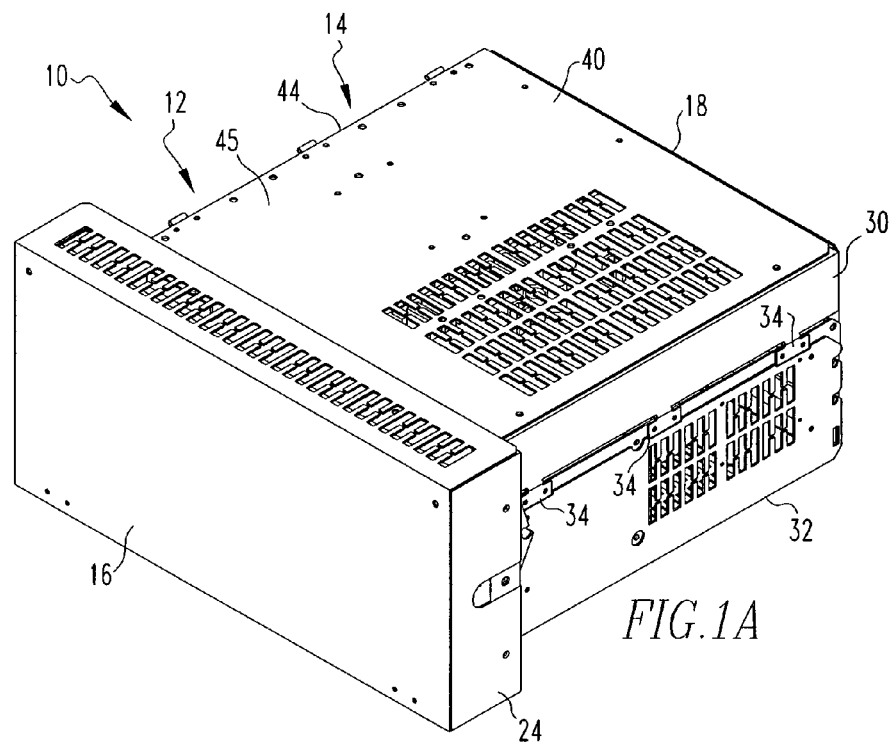
FIG. 1A is a front isometric view of the housing assembly in a first position.
Figure 1B:
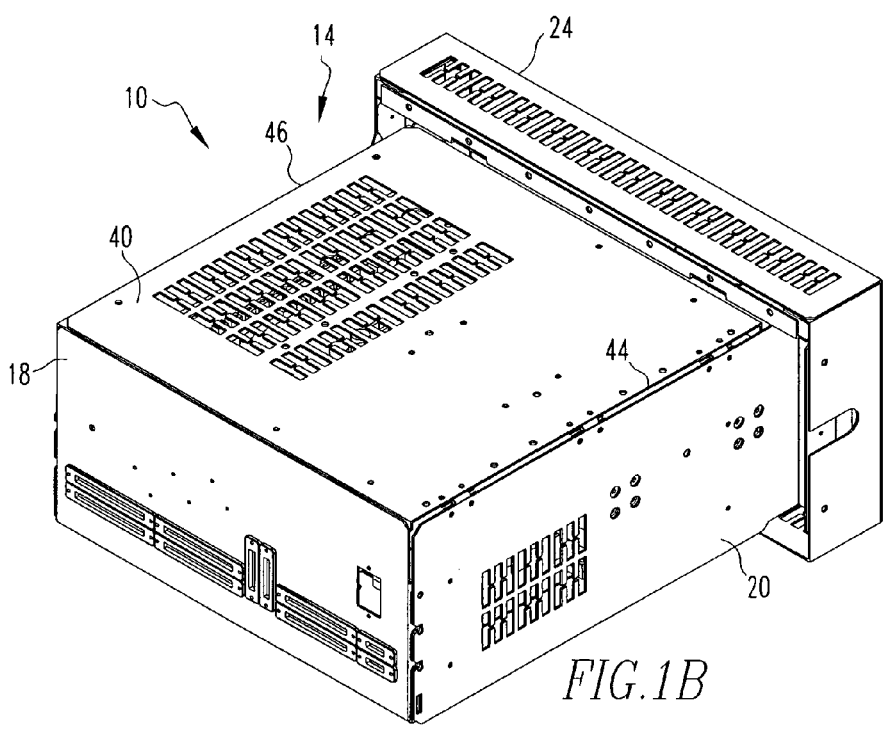
FIG. 1B is a back isometric view of the housing assembly in a first position.
Figure 1C:
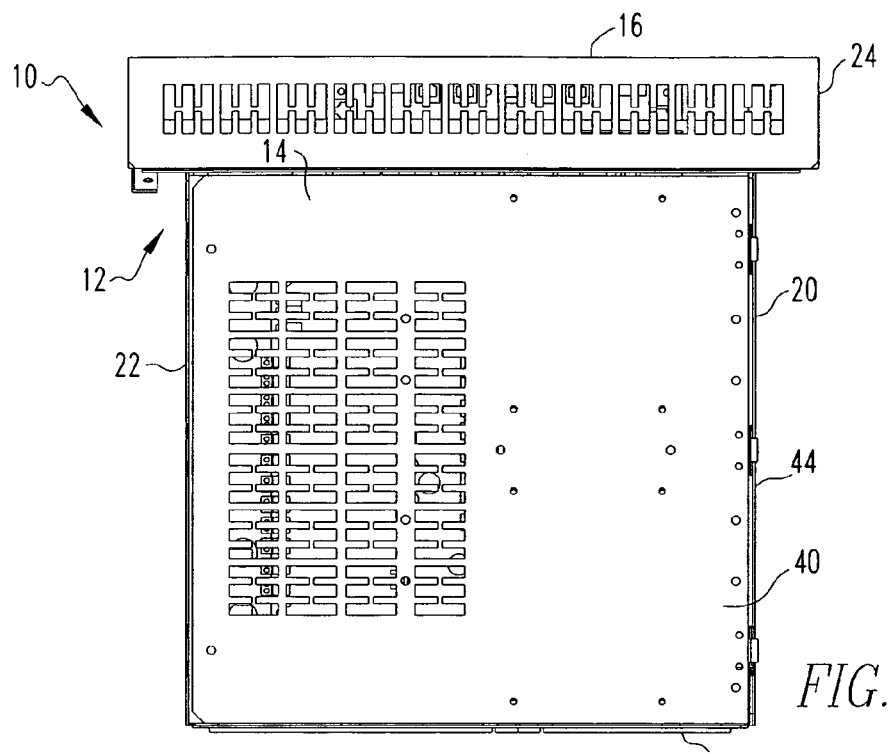
FIG. 1C is a top view of the housing assembly in a first position.
Figure 1D:
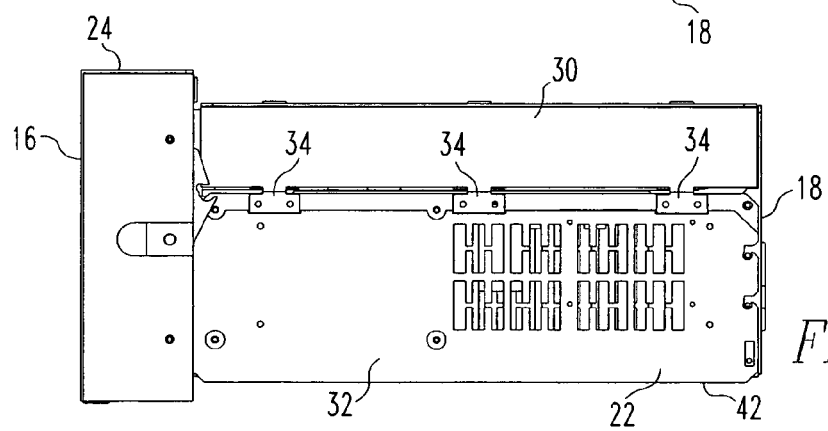
FIG. 1D is a side view of the housing assembly in a first position.
Figure 1E:
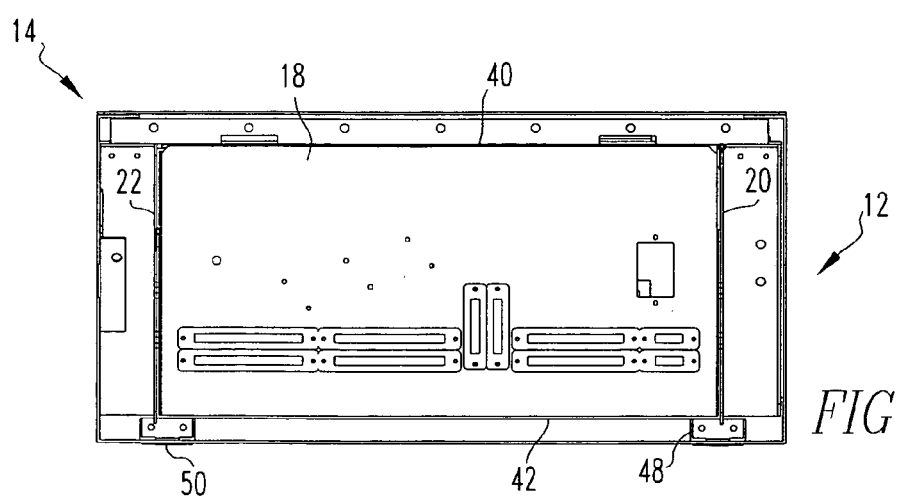
FIG. 1E is a back view of the housing assembly in a first position.

As used herein, the phrases "full sized" and "half sized" relate to a ratio between one mounting plate and the plan area of the housing assembly. That is, for example, a "full sized" plate member will be substantially the same size as the full plan area of the housing assembly.

As used herein, directional terms, such as "upper" and "lower" relate to the housing assembly as shown in the Figures and are not limiting upon the claims.

As shown in FIGS. 1A–1E, a housing assembly 10 includes a plurality of vertical walls 12 and a plurality of mounting plate members 14. The plurality of vertical walls 12 and plurality of mounting plate members 14 are preferably made of steel. The plurality of vertical walls 12 includes a front wall 16, a back wall 18, a first side wall 20, and a second side wall 22. In the preferred embodiment, each wall of the plurality of walls 12 is rectangular having an upper edge, a lower edge, and lateral edges. The edges shall be identified by reference numbers as needed below. For example, the front wall 16 includes a lower edge 17 and the back wall 18 also includes lower edge 19. Generally, the front wall 16 and the back wall 18 extend in a generally parallel direction and the first side wall 20 and the second side wall 22 extend in a generally parallel direction. The front and back walls 16, 18 are generally perpendicular to the first and second side walls 20, 22. Thus, the vertical walls 12 generally form a rectangle. The front wall 16 may be coupled to an extended frame 24. The extended frame 24 is larger than the back wall 18 and, as such, the front wall 16 and extended frame 24 extend beyond the side walls 20, 22. The side walls 20, 22 are coupled to the extended frame 24 adjacent, but not immediately adjacent, to the front wall 16 lateral edges. Additionally, the second side wall 22 may be a medially-hinged wall. That is, the second side wall 22 has an upper portion 30, a lower portion 32, and a hinge assembly 34 coupling the upper portion 30 and the lower portion 32.

Figure 2A:
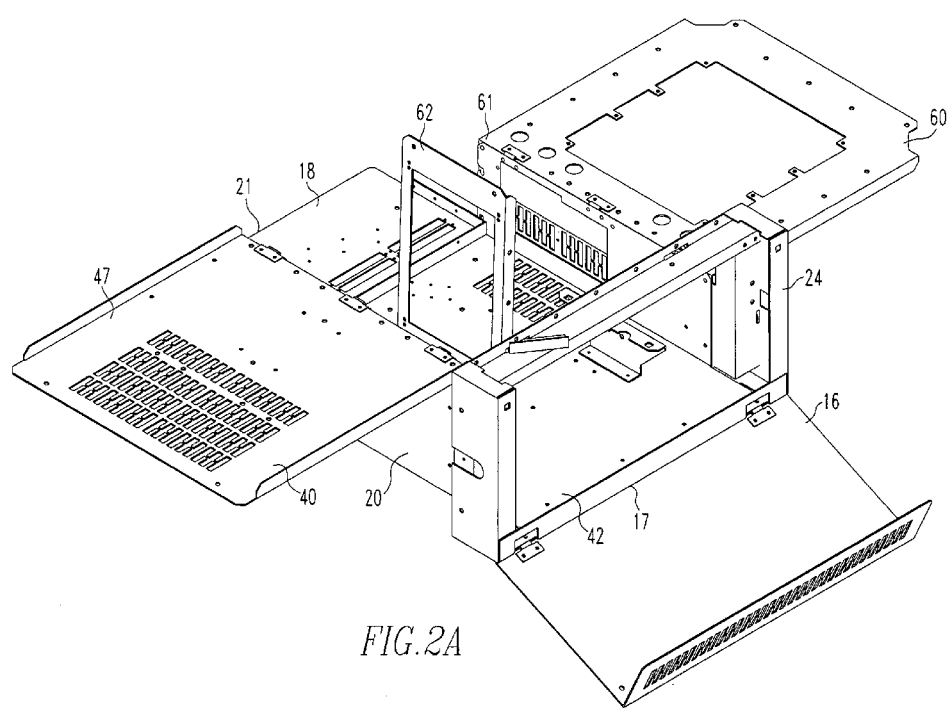
FIG. 2A is a front isometric view of the housing assembly in a second position.
Figure 2B:
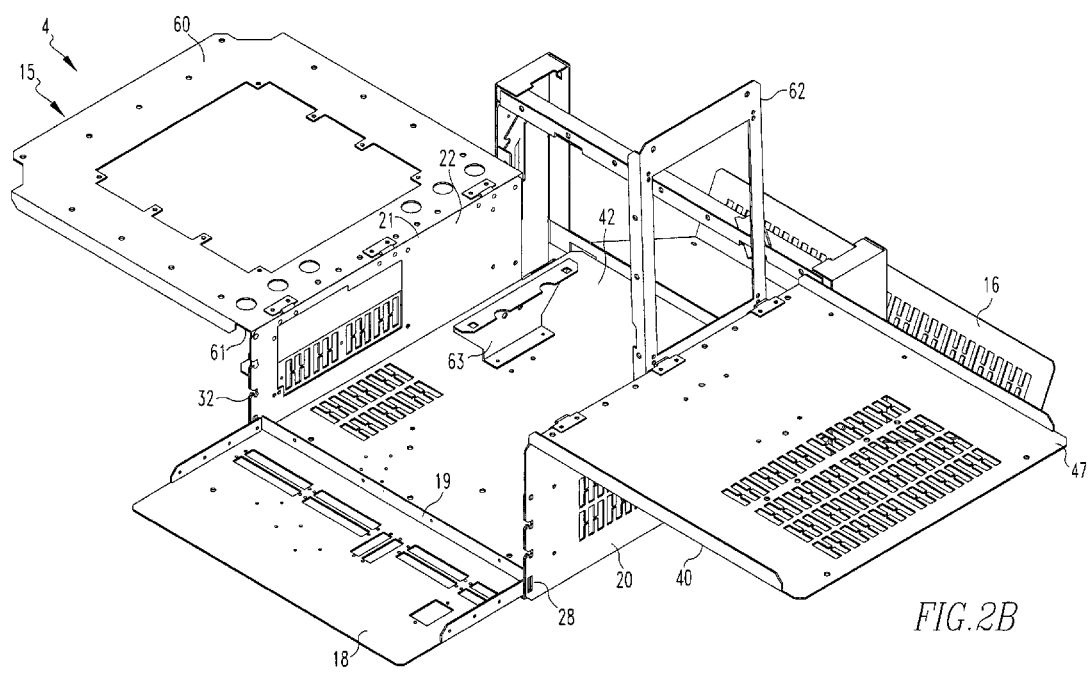
FIG. 2B is a back isometric view of the housing assembly in a second position.
Figure 2C:
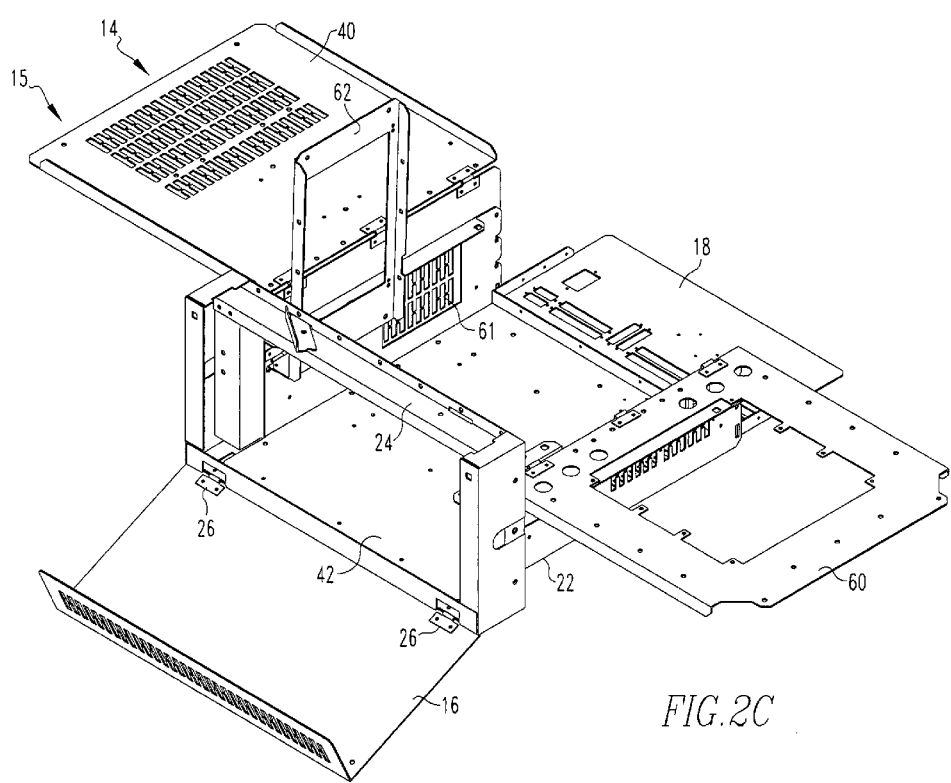
FIG. 2C is another front isometric view of the housing assembly in a second position.

The front wall lower edge 17 is pivotally coupled to the extended frame 24. Preferably, the front wall lower edge 17 is coupled to the extended frame 24 by two hinge assemblies 26 (FIG. 2A). The back wall 18 is pivotally coupled to the first and second side walls 20, 22 by pivot pins 28 located adjacent to the back wall lower edge 19. The pivot pins 28 extend through openings in the first and second side walls 20, 22. Accordingly, both the front and back walls 16, 18 may be moved between a first position, wherein the front and back walls 16, 18 extend generally vertically, and a second position wherein the front and back walls 16, 18 extend generally horizontally.

Figure 2D:
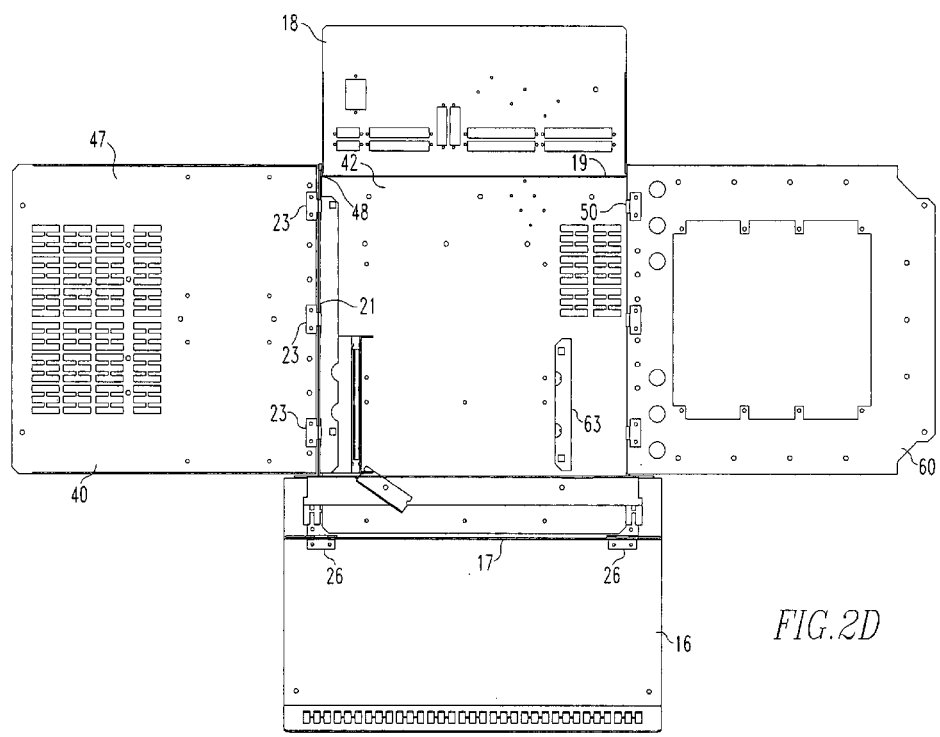
FIG. 2D is a top view of the housing assembly in a second position.
Figure 2E:
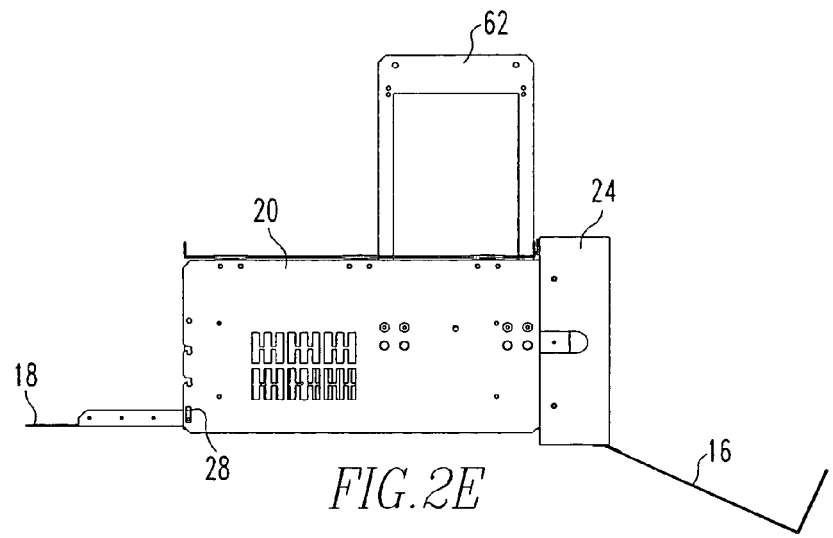
FIG. 2E is a side view of the housing assembly in a second position.
Figure 2F:
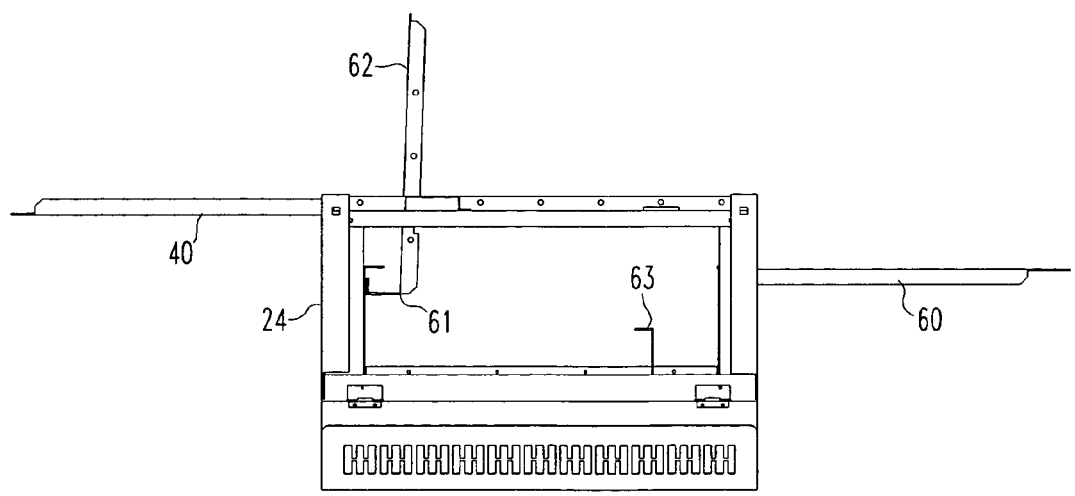
FIG. 2F is a front view of the housing assembly in a second position.

As shown best in FIGS. 2A–2F, the plurality of mounting plate members 14 includes at least an upper mounting plate member 40 and a bottom mounting plate member 42. The bottom mounting plate member 42 is stationary. The bottom mounting plate member 42 includes a first lateral edge 48 and a second lateral edge 50 (FIG. 2D). The first and second side walls 20, 22 are coupled to the first lateral edge 48 and the second lateral edge 50, respectively, and extend generally upwardly therefrom.

The remaining mounting plate members 14 include one or more movable mounting plate members 15. The movable mounting plate members 15 are pivotally coupled to one of the vertical walls. For example, the upper mounting plate member 40 includes a first lateral edge 44 and a second lateral edge 46, as well as an outer side 45 and an inner side 47 (FIG. 2A). The first side wall 20 includes an upper edge 21. The upper mounting plate member 40 is pivotally coupled to the first side wall upper edge 21. Preferably, the upper mounting plate member 40 is coupled to the first side wall upper edge 21 by hinge assemblies 23. In a more preferred embodiment, the hinge assemblies 23 are mortise hinges. Thus, the upper mounting plate member 40 is structured to move between a first position where the upper mounting plate member 40 extends generally horizontally over the bottom mounting plate member 42, and a second position where the upper mounting plate member 40 has been pivoted about 180 degrees so that the upper mounting plate member 40 extends generally horizontally to the side of the bottom mounting plate member 42.

The plurality of mounting plate members 14 may include multiple interior mounting plate members depending upon the size of the interior mounting plates and the size of the housing assembly 10. As shown in FIGS. 2A–2F, there are, preferably, three full sized mounting plates including the upper mounting plate member 40 and the bottom mounting plate member 42, as well as a first interior mounting plate member 60. There is also a half-sized second interior mounting plate member 62. There may, however, be any combination of interior mounting plate members. The first interior mounting plate member 60 includes a lateral edge 61 and the second interior mounting plate member 62 includes a lateral edge 63. The first interior mounting plate member 60 is coupled by its lateral edge 61 to the second side wall upper portion 30 just above the hinge assembly 34. Thus, the first interior mounting plate member 60 is structured to move between a first position where the first interior mounting plate member 60 extends generally horizontally over the bottom mounting plate member 42, and a second position where the first interior mounting plate member 60 has been pivoted about 180 degrees so that the first interior mounting plate member 60 extends generally horizontally to the side of the bottom mounting plate member 42.

The second interior mounting plate member 62 is coupled by its lateral edge 63 to a medial portion of the first side wall 20. The distal edge of the second interior mounting plate member 62 may be supported by a support 65 attached to the bottom mounting plate member 42. Each of the multiple interior mounting plate members is pivotally attached to a medial portion of either the first or second side wall 20, 22. The multiple interior mounting plate members are generally not aligned with a plate extending from an opposite side wall 20, 22. For example, the first interior mounting plate member 60 is disposed at an upper medial location on the second side wall 22 and the second interior mounting plate member 62 is coupled to a lower medial portion of the first side wall 20. However, if two or more interior mounting plate members have a width that is less than half the width of the bottom mounting plate member 42, the interior mounting plate members may be mounted generally opposite of each other. The second interior mounting plate member 62 is structured to pivot between a first, generally horizontal position, wherein the second interior plate member 62 extends over the bottom mounting plate member 42, and a second position, wherein the second interior mounting plate member 62 extends generally vertically.

Accordingly, the housing assembly 10 may be in either a first, closed configuration, as shown in FIGS. 1A–1E or in a second, open configuration, as shown in FIGS. 2A–2F. In the closed configuration, that is, when the mounting plate members are in the first position, the housing assembly 10 forms an enclosure structured to protect electronic components. In the open configuration, that is, when the mounting plate members are in the second position, the interior of housing assembly 10 is accessible. As shown in FIGS. 3A–3E, the mounting plate members 14 are each structured to support one or more electronic components 70. The electronic components 70 include, but are not limited to printed circuit boards 72, input/output connectors 74, and a power supply 76. The printed circuit boards 72 are, preferably, coupled to the mounting plate members 14 or the back wall 18. The input/output connectors 74 are preferably coupled to the back wall 18. The power supply 76 is preferably coupled to the bottom plate member 42. The electronic components 70 are coupled to each other, or to an input/output connector 74, by one or more flexible electric cables 80, such as, but not limited to, power cords, ribbon cables, and other bus cables. The cables 80 are structured to have a sufficient length so that the electronic components 70 may remain coupled to each other when the housing assembly 10 is in the second, open configuration.

Figure 3A:
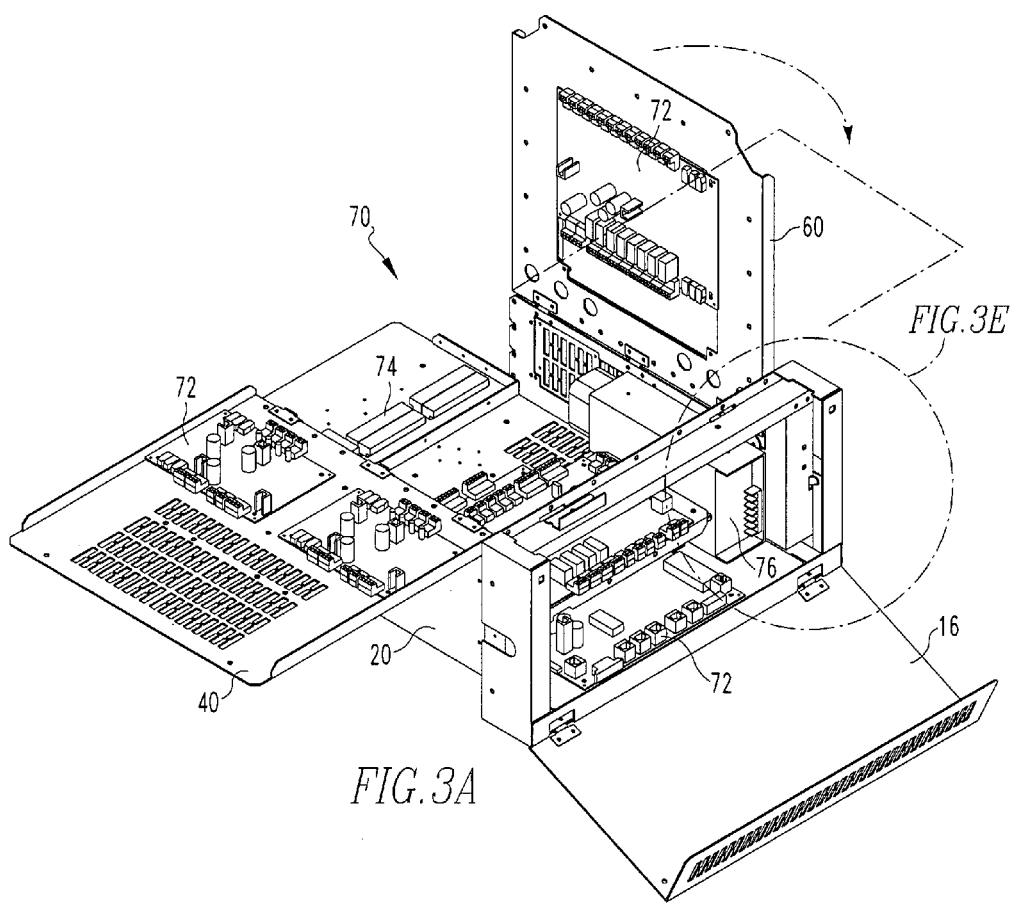
FIG. 3A is a front isometric view of the housing assembly, with electrical components, in a second position.
Figure 3B:
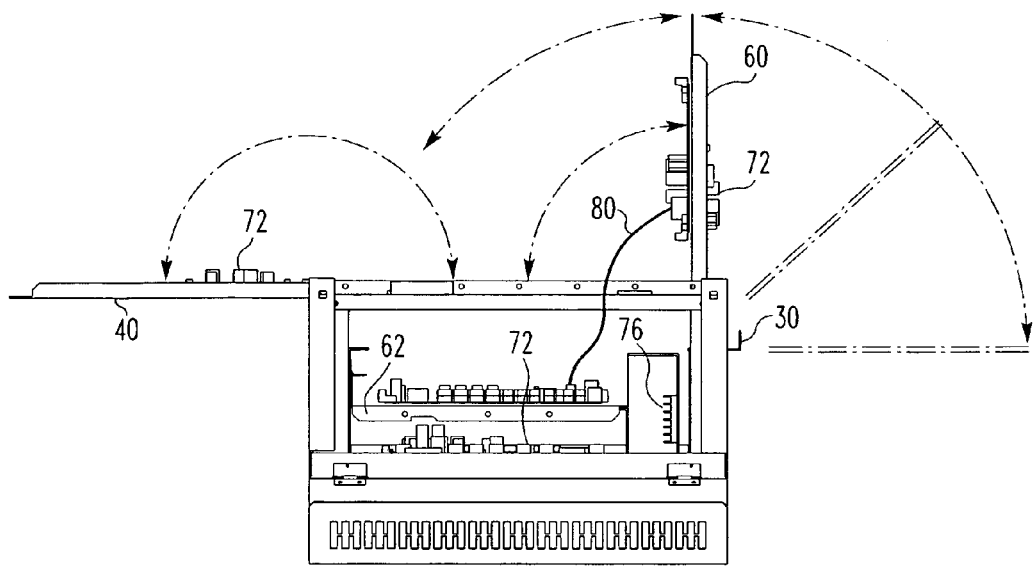
FIG. 3B is a front view of the housing assembly, with electrical components, in a second position.
Figure 3C:
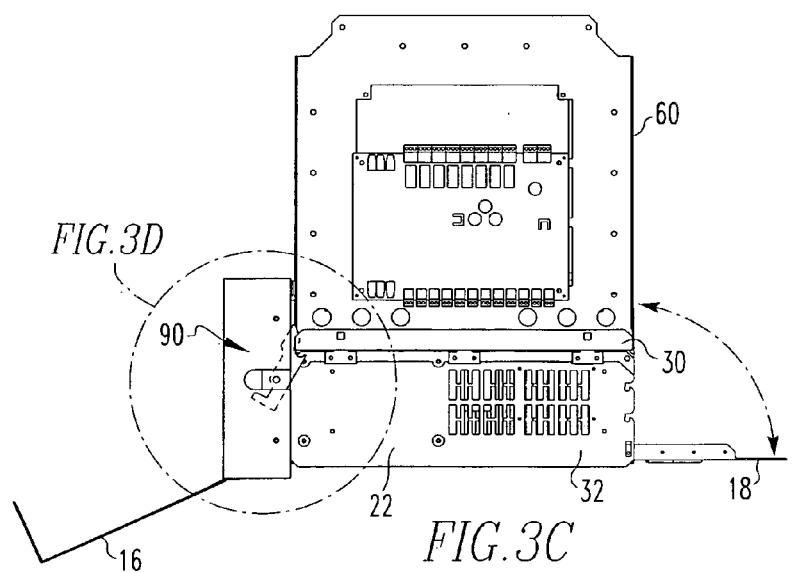
FIG. 3C is a side view of the housing assembly, with electrical components, in a second position.
Figure 3D:
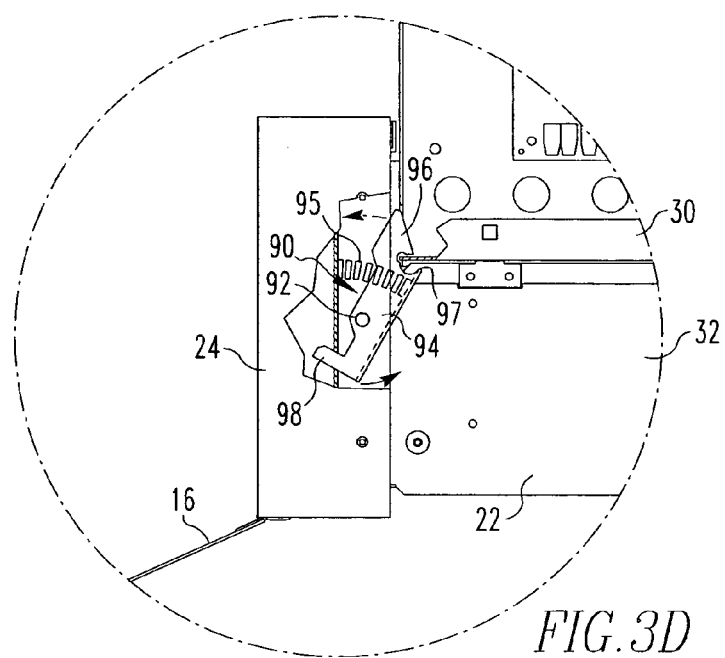
FIG. 3D is a detail side view of the latch assembly.
Figure 3E:
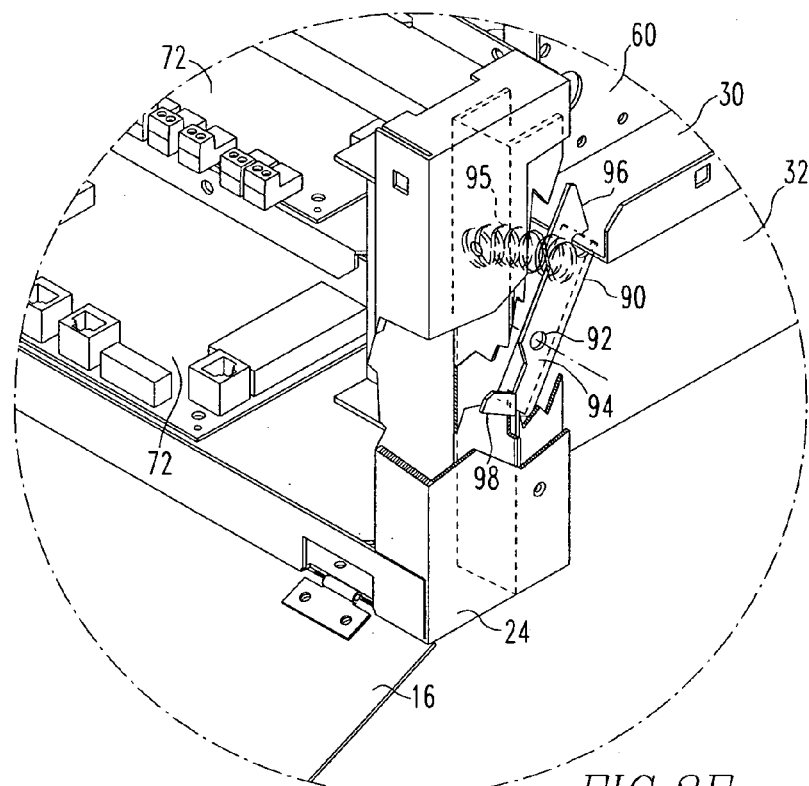
FIG. 3E is a detail side isometric view of the latch assembly.

As shown in FIGS. 3C–3D, the housing assembly 10 may also include a support latch assembly. The support latch assembly 90 is structured to hold the first interior mounting plate member 60 in a generally vertical orientation. The support latch assembly 90 is coupled to the extended frame 24. The support latch assembly 90 includes a pivot pin 92, a latch member 94 and a spring 95. The latch member 94 includes an angled first end 96, a stop edge 97 and a handle end 98. The pivot pin 92 is coupled to, and extends from, the extended frame 24 adjacent to the second side wall upper portion 30. The latch member 94 is mounted on the pivot pin 92 and structured to move between a first, extended position and second, retracted position as described below. The latch member 94 is biased to the first position by the spring 95. In the first position, the latch member angled first end 96 is disposed in the path of travel of the second side wall upper portion 30 as it moves between the second side wall upper portion 30 first and second positions. As the second side wall upper portion 30 contacts the latch member angled first end 96, the latch member 94 is moved to the retracted second position, thereby allowing the second side wall upper portion 30 to move past the latch member first end 96. As the second side wall upper portion 30 moves adjacent to the stop edge 97, the latch member 94 moves back into the first, extended position thereby causing the second side wall upper portion 30 to contact the stop edge 97. When the second side wall upper portion 30 contacts the stop edge 97, the second side wall upper portion 30 is held in a generally horizontal orientation and the first interior mounting plate member 60 is in a generally vertical orientation. To release the second side wall upper portion 30, a user depresses the latch member handle end 98 causing the latch member 94 to rotate about the pivot pin 92 into the second, retracted position and allowing the second side wall upper portion 30 to move to the second side wall upper portion 30 second position.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A housing assembly, structured to enclose a plurality of electrical components and flexible cables, each said electrical component coupled at least one other electrical component or to an input device by said cables, said housing assembly comprising:

a plurality of mounting plate members, including at least a bottom mounting plate member and at least one movable mounting plate member, each mounting plate structured to support one or more electrical components;

a plurality of vertical walls including a front wall coupled to, and extending generally perpendicular to, said base plate member, a first side wall coupled to, and extending generally perpendicular to, said base plate member, a second side wall coupled to, and extending generally perpendicular to, said base plate member, a back wall coupled to, and extending generally perpendicular to, said base plate member;

said at least one movable mounting plate member pivotally coupled to said at least one vertical wall and structured to move between a first, closed position and a second open position; and whereby a plurality of electronic components may be coupled to each plate in said plurality of plates, and whereby said electronic components remain coupled to each other as said movable mounting plates move between said first, closed position and said second, open position.

2. The housing assembly of claim 1, wherein said front wall and said back wall are pivotally coupled to said bottom support plate member.

3. The housing assembly of claim 1, wherein said each said movable mounting plate member is coupled to one of said plurality of vertical walls.

4. The housing assembly of claim 3, wherein:

said first side wall and said second side wall each includes a lower edge, a medial portion and an upper edge;

said at least one movable mounting plate member includes an upper mounting plate member; and said upper mounting plate member being pivotally coupled to said first wall upper edge and structured to move between a first position where said upper mounting plate member extends generally horizontally over said bottom mounting plate member, and a second position where said upper mounting plate member has been pivoted about 180 degrees so that said upper mounting plate member extends generally horizontally to the side of said bottom mounting plate member.

5. The housing assembly of claim 4, wherein:

said at least one movable mounting plate member includes a first interior mounting plate member and a second interior mounting plate member;

said first interior mounting plate member coupled to said second side wall;

said second interior mounting plate member pivotally coupled to said first side wall and structured to pivot between a first, generally horizontal position, wherein said second interior mounting plate member extends over said bottom mounting plate member, and a second position, wherein said second interior mounting plate member extends generally vertically.

6. The housing assembly of claim 5, wherein:

said second side wall includes an upper portion and a lower portion, said upper portion and said lower portion coupled by a hinge assembly;

said first interior mounting plate member coupled to said second side wall upper portion whereby said first interior mounting plate member is structured to move between a first position where said first interior mounting plate member extends generally horizontally over said bottom mounting plate member, and a second position where said first interior mounting plate member has been pivoted about 180 degrees so that said first interior mounting plate member extends generally horizontally to the side of said bottom mounting plate member.

7. The housing assembly of claim 6, wherein said movable mounting plate members are coupled to said first or second side walls by mortise hinges.

8. The housing assembly of claim 7, wherein said front and back vertical walls are pivotally coupled to said base plate member.

9. A housing assembly comprising:
a plurality of mounting plate members, including at least a bottom mounting plate member and at least one movable mounting plate member, each mounting plate member structured to support one or more electrical components;
a plurality of vertical walls including a front wall coupled to, and extending generally perpendicular to, said base plate member, a first side wall coupled to, and extending generally perpendicular to, said base plate member, a second side wall coupled to, and extending generally perpendicular to, said base plate member, a back wall coupled to, and extending generally perpendicular to, said base plate member;
said at least one movable mounting plate member pivotally coupled to said at least one vertical wall and structured to move between a first, closed position and a second open position;
a plurality of electrical components, each said electrical component coupled to either a mounting plate member or a vertical wall;
one or more flexible cables structured to couple said electrical components to each other; and
whereby said electronic components remain coupled to each other as said movable mounting plates move between said first, closed position and said second, open position.

10. The housing assembly of claim 9, wherein said front wall and said back wall are pivotally coupled to said bottom support plate member.

11. The housing assembly of claim 9, wherein said each said movable mounting plate member is coupled to one of said plurality of vertical walls.

12. The housing assembly of claim 11, wherein:
said first side wall and said second side wall each includes a lower edge, a medial portion and an upper edge;
said at least one movable mounting plate member includes an upper mounting plate member; and
said upper mounting plate member being pivotally coupled to said first wall upper edge and structured to move between a first position where said upper mounting plate member extends generally horizontally over said bottom mounting plate member, and a second position where said upper mounting plate member has been pivoted about 180 degrees so that said upper mounting plate member extends generally horizontally to the side of said bottom mounting plate member.

13. The housing assembly of claim 12, wherein:
said at least one movable mounting plate member includes a first interior mounting plate member and a second interior mounting plate member;
said first interior mounting plate member coupled to said second side wall;
said second interior mounting plate member pivotally coupled to said first side wall and structured to pivot between a first, generally horizontal position, wherein said second interior mounting plate member extends over said bottom mounting plate member, and a second position, wherein said second interior mounting plate member extends generally vertically.

14. The housing assembly of claim 13, wherein:
said second side wall includes an upper portion and a lower portion, said upper portion and said lower portion coupled by a hinge assembly;
said first interior mounting plate member coupled to said second side wall upper portion whereby said first interior mounting plate member is structured to move between a first position where said first interior mounting plate member extends generally horizontally over said bottom mounting plate member, and a second position where said first interior mounting plate member has been pivoted about 180 degrees so that said first interior mounting plate member extends generally horizontally to the side of said bottom mounting plate member.

15. The housing assembly of claim 14, further including a latch assembly structured to hold said second side wall upper portion in a generally horizontal orientation and said first interior mounting plate member in a generally vertical orientation.

16. The housing assembly of claim 14, wherein said plurality of electronic components includes printed circuit boards, input/output connectors, and a power supply.

17. The housing assembly of claim 16, wherein each said mounting plate member supports a printed circuit board.

18. The housing assembly of claim 16, wherein each said input/output connector is coupled to said back wall.

19. The housing assembly of claim 14, wherein said movable mounting plate members are coupled to said first or second side walls by mortise hinges.

20. The housing assembly of claim 19, wherein said front and back vertical walls are pivotally coupled to said base plate member.

* * * * *